United States Patent [19]

Saito

[11] Patent Number: 4,741,601
[45] Date of Patent: May 3, 1988

[54] NON-LINEAR DEVICE FOR DRIVING LIQUID CRYSTAL DISPLAY

[75] Inventor: Takeshi Saito, Tokyo, Japan

[73] Assignee: NEC Corporation, Tokyo, Japan

[21] Appl. No.: 785,552

[22] Filed: Oct. 8, 1985

[30] Foreign Application Priority Data

Oct. 8, 1984 [JP] Japan ............................... 59-210738

[51] Int. Cl.$^4$ ..................... G02F 1/133; H01L 45/00
[52] U.S. Cl. ............................ 350/339 R; 350/331 R; 357/2; 357/59
[58] Field of Search ................... 350/332, 339 R, 334, 350/340, 331 R, 333; 357/2, 4, 30, 49, 59 B

[56] References Cited

U.S. PATENT DOCUMENTS

| | | | |
|---|---|---|---|
| 3,972,035 | 7/1976 | Holtzberg et al. | 357/4 |
| 4,065,780 | 12/1977 | Ballantyne | 357/4 |
| 4,226,898 | 10/1980 | Ovshinsky et al. | 357/2 |
| 4,415,760 | 11/1983 | Madan | 357/2 |
| 4,492,811 | 1/1985 | Switzer | 357/30 E |
| 4,545,111 | 10/1985 | Johnson et al. | 357/2 |
| 4,567,499 | 1/1986 | Hockley et al. | 357/59 B |
| 4,582,395 | 4/1986 | Morozomi | 350/333 |
| 4,589,733 | 5/1986 | Yaniv et al. | 350/332 |
| 4,665,504 | 5/1987 | Hockley et al. | 357/59 B |
| 4,684,972 | 8/1987 | Owen et al. | 357/59 B |
| 4,686,553 | 8/1987 | Possin | 357/59 B |

*Primary Examiner*—John K. Corbin
*Assistant Examiner*—Martin Lerner
*Attorney, Agent, or Firm*—Burns, Doane, Swecker & Mathis

[57] ABSTRACT

A non-linear device used for driving a liquid crystal display is disclosed. This non-linear device comprises a first amorphous silicon layer, an insulator film deposited on the first silicon layer and a second amorphous silicon layer deposited on said insulator film. The insulator film may be made of silicon oxide or silicon nitride. The non-linear device thus has an SIS structure.

5 Claims, 3 Drawing Sheets

NON-LINEAR DEVICE FOR DRIVING LIQUID CRYSTAL DISPLAY

BACKGROUND OF THE INVENTION

The present invention relates a bidirectional non-linear device, and more particularly to such a device for a liquid crystal display.

A bidirectional non-linear device such as a varistor represents a non-linear change in voltage-current characteristic and therefore has been discussed in recent years as a device for driving a liquid crystal display cell. As a device used for this purpose, a non-linear device with a metal-insulator-metal structure (called hereinafter as a "MIM device") has been proposed in Technical Digest of IEDM, pp 707–710, 1980.

This MIM device is composed of a lower metal electrode made of tantalum (Ta) formed on a glass substrate, an anodized tantalum oxide (Ta2O5) layer formed on the lower metal electrode, and an upper metal electrode made of chromium (Cr). When a voltage above a threshold level is applied between the lower and upper electrodes, electrons are transmitted therebetween the tunnel effect through the traps in the anodized oxide layer, so that the non-linear phenomenon is obtained in the voltage-current characteristic. However, the anodized oxide is a relatively porous, and hence the structural defects such as pinholes are easy to be formed in the anodized oxide film. The MIM device having the structural defects cannot represent the non-linear characteristic and thus cannot drive the liquid crystal display cell. Assuming that 1% structural defect is generated in MIM devices for driving one hundred thousand pieces of liquid crystal display cells, one thousand pieces of display cells are not driven. In other words, it is difficult to put the liquid crystal display employing MIM devices into practical use.

SUMMARY OF THE INVENTION

It is, therefore, an object of the present invention to provide a novel non-linear device in which the generation of its structural defects is prevented or reduced greatly.

It is another object of the present invention to provide a non-linear device for a liquid crystal display.

A non-linear device according to the present invention comprises a first amorphous silicon layer, an insulator film made of a compound of silicon such as silicon oxide or silicon nitride and formed on the first amorphous silicon layer, and a second amorphous silicon layer formed on the insulator film.

Thus, the non-linear device according to the present invention has a silicon-insulator-silicon (SIS) structure. The insulator film is made of the compound of silicon which is a non-porous film. The first amorphous silicon layer, the insulator film and the second amorphous silicon layer are favorably successively deposited by the plasma CVD (chemical vapor deposition) method in a continuous manner with the material gases being only changed; so that the interfaces between the steps of forming the first silicon layer and the insulator film and between the steps of forming the insulator film and the second silicon layer are free from contamination. The SIS device is thus prevented from the structural defects caused by pinholes formed in the insulator film.

The first and second silicon layers are doped with impurities to reduce their resistivity. Alternatively, each of the first and second silicon layers may be formed of two layers, one of which is doped with impurities at a high concentration, the other being a non-doped or intrinsic layer. In the latter case, the insulator layer is interposed between the non-doped layers in the first and second amorphous silicon layers.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 1:
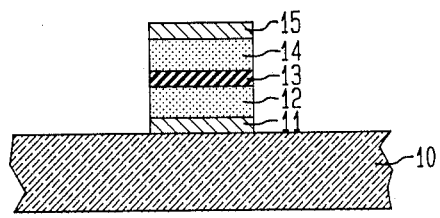
FIG. 1 is a cross-sectional view showing an embodiment of the present invention.

Referring to FIG. 1, there is shown a non-linear device according to an embodiment of the present invention. A glass substrate 10 is selectively covered with a chromium (Cr) layer 11 operating as a lower electrode. A first amorphous silicon layer 12 is formed on the chromium layer 11. The silicon layer 12 is doped with N-type impurities at a concentration of about $10^{19} cm^{-3}$ and has a thickness of about 1 μm. An insulator film 13 made of a compound of silicon, such as silicon oxide or silicon nitride, is deposited on the silicon layer 12. The thickness of the insulator film 13 depends on a threshold level desired as a non-linear devide for driving a liquid crystal display cell and is selected to be 100 Å to 500 Å. In this embodiment, the film 13 is of silicon dioxide and its thickness is designed to be 300 Å to obtain a threshold level of 5 $\overline{V}$. A second amorphous silicon layer 14 is formed on the insulator film 13, which is doped with N-type impurities at a concentration of about $10^{19} cm^{-3}$ and has a thickness of about 1 μm. Deposited on the silicon layer 14 is a transparent electrode 15 made of indium tin oxide. The non-linear device shown in FIG. 1 thus has a silicon-insulator-silicon (SIS) structure.

Figure 2:
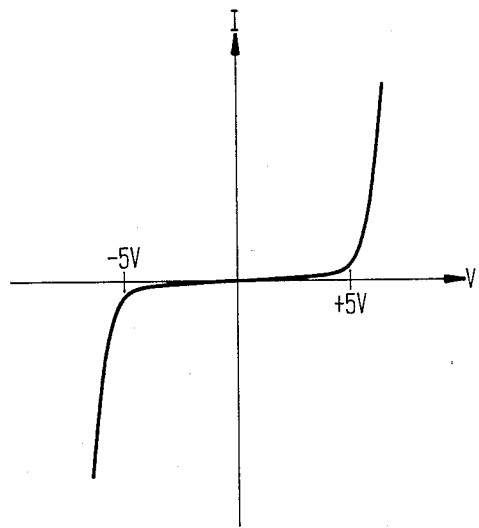
FIG. 2 is a graph representing a voltage-current characteristic of the device shown in FIG. 1.

The voltage-current characteristic of this SIS device is shown in FIG. 2. When the voltage applied between the electrodes 11 and 15 (i.e., between the first and second silicon layers 12 and 14) is lower in absolute value than 5 $\overline{V}$, a substantial current does not flow between the silicon layer 12 and 14. The SIS device is therefore in a nonconductive state and presents a high isolation resistance. When the applied voltage exceeds 5 $\overline{V}$ in absolute value, electrons are transmitted between the silicon layers 12 and 14 through the insulator film 13 by the tunnel effect, as shown in FIG. 2. The SIS device is thus brought into a conductive state and represents a very small resistance.

Figure 3:
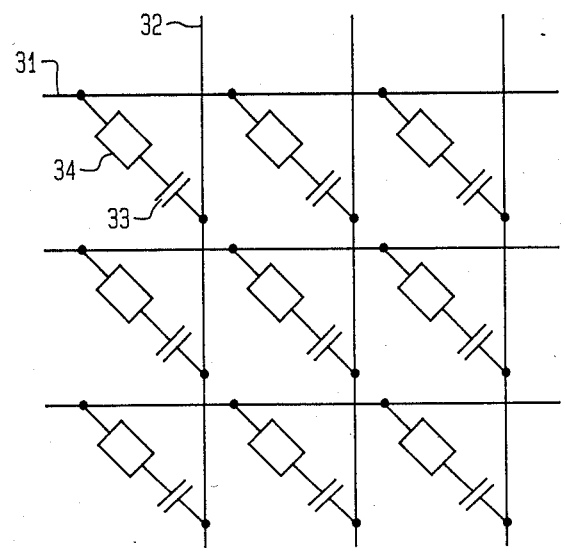
FIG. 3 is an equivalent circuit diagram of a liquid crystal display cell array.

In a liquid crystal display, as shown in FIG. 3, signal lines 31 supplied with synchronizing pulse signals are arranged in a row direction, and data lines 32 supplied video information signals containing color and/or brightness information are arranged in a column direction. A series connection of the SIS device 34 shown in FIG. 1 and a liquid crystal display cell 33 is disposed at the respective intersections of the signal and data lines 31 and 32. The signal line 31 is connected to the lower electrode 11 (see FIG. 1) of the SIS device 34 and the upper electrode 15 thereof operates as one electrode of the display cell 33.

When an ON voltage Von above the threshold voltage $V_{TH}$ of the SIS device 34 ($V_{TH}$ being 5 $\overline{V}$ in this embodiment) is applied between the selected signal and data lines 31 and 32, the SIS device disposed at the intersection of the selected signal and data lines is turned ON, so that the liquid crystal display cell is supplied with a voltage of $V_{ON}$-$V_{TH}$. On the other hand, when the applied voltage take a value of Voff below the threshold level $V_{TH}$, the SIS device 34 is turned OFF, so that the liquid crystal display cell 33 is not supplied with a subtantial voltage. Thus, the change in voltage effectively supplied to the liquid crystal display cell 33 is considerably large. As a result, the contrast in the displayed picture is advantageous and a liquid crystal display having a large display capacity is realized.

Turning back to FIG. 1, the first amorphous silicon layer 12, the insulator film 13 and the second amorphous silicon layer 14 are formed continuously by the plasma CVD method. More specifically, the glass substrate 10 covered selectively with the chromium layer 11 is disposed in a reaction chamber of the plasma CVD equipment. The reaction chamber is supplied at first with a mixture of a silane gas ($SiH_4$), a phosphine gas and a carrier gas ($H_2$, for example), so that the first amorphous silicon layer 12 is deposited. After the layer 12 is deposited to a desired thickness, the phosphine gas is replaced by an oxygen gas ($O_2$) to form a silicon oxide film as the insulator film 13 deposited on the silicon layer 12. When a silicon nitride film is to be deposited as the insulator film 13, a nitrogen gas ($N_2$) or an ammonia gas ($NH_3$) is employed in place of an oxygen gas. The oxygen gas or nitrogen gas or ammonia gas is changed again to the phosphine gas to form the second amorphous silicon layer 14 doped with N-type impurities. Indium tin oxide is thereafter deposited on the silicon layer 14 to form the transparent electrode 15.

As described above, the layer 12, 13 and 14 are formed continuously without carrying out the substrate 10 from the reaction chamber of the plasma CVD equipment. Accordingly, the respective layers 12, 13 and 14 are free from contamination to remarkably reduce pinholes which may be formed in the insulator layer 13. As a result, the generation of the structural defects in the SIS device is substantially prevented. In other words, the number of the defect display cell is remarkably reduced.

Arsenic (As) or antimony (Sb) can be used as the N-type impurity doped in the silicon layer 12 and 14. P-type impuritie may be employed as doping impurities in the layers 12 and 14.

Figure 4:
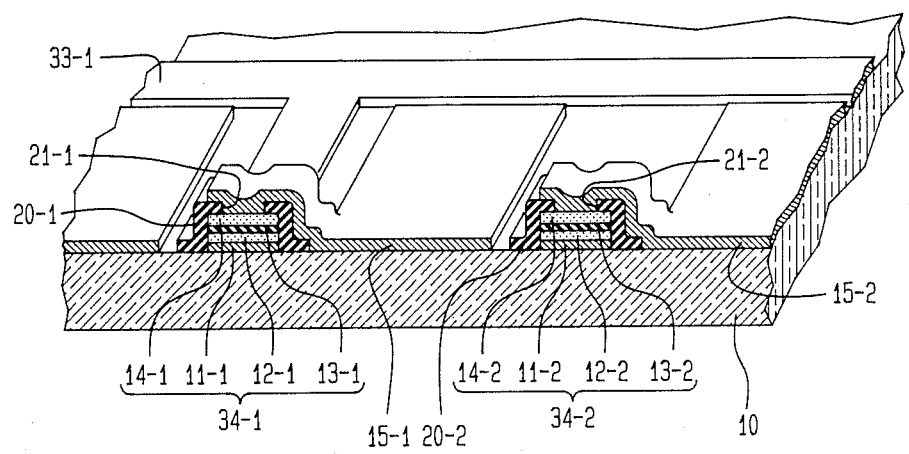
FIG. 4 is a cross-sectional view representing a part of the display cell array using the device shown in FIG. 1.

FIG. 4 shows a device structure of a required crystal display cell array, in which only two SIS devices 34-1 and 34-2 connected to one signal line 33-1 are shown. The signal line 33-1 is made of chromium and elongated in a row direction on the substrate 10. The signal line 33-1 is further expanded partially from its plural portion in a column direction. The expanded portions of the signal line 33-1 are connected to the lower electrodes 11-1 and 11-2 of the SIS devices 34-1 and 34-2, respectively. As already mentioned with respect to FIG. 1, the first amorphous silicon layer 12, the insulator layer 13 and the second amorphous silicon layer 14 are formed continuously, and the respective layers 12 to 14 are then selectively etched away to form SIS devices 34-1 and 34-2 made of three layers 12-1 to 14-1 and 12-2 to 14-2. The upper and side surfaces of the SIS devices 34-1 and 34-2 are covered with insulation film 20-1 and 20-2 made of CVD silicon oxide. The oxide films 20-1 and 20-2 are selectively removed to form contact holes 21-1 and 21-2. The upper electrodes 15-1 and 15-2 make contact with the second silicon layers 14-1 and 14-2 by the contact holes 21-1 and 21-2, respectively. The upper electrodes 15-1 and 15-2 are elongated over the substrate 10 between the respective SIS devices with a relatively wide area. The elongated portions of the electrodes 15-1 and 15-2 thus function as one electrode of each liquid crystal display cell. Although not shown, a liquid crystal is coated over the entire surface, and a glass board is disposed on the coated liquid crystal layer. The data lines 32 (see FIG. 2) made of indium tin oxide are formed on the glass board in a column direction. Each of data lines 32 also operates as the other electrode of each liquid crystal display cell 33.

Figure 5:
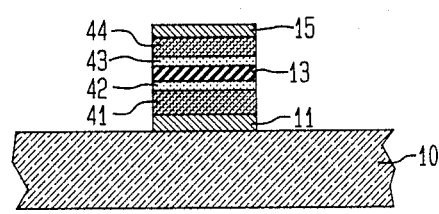
FIG. 5 is a cross-sectional view showing another embodiment of the present invention.

FIG. 5 shows another embodiment of the present invention, in which the same constituents as those shown in FIG. 1 are denoted by the same reference numerals. In an SIS device shown in FIG. 5, the first amorphous silicon layer is formed of an N (or P)-type impurity doped layer 41 and a non-doped layer, i.e., an intrinsic layer 42. The second amorphous silicon layer is also formed of an impurity doped layer 44 and a non-doped layer 43. In the device shown in FIG. 1, the insulator film 13 is interposed between the impurity doped layers 12 and 14, and therefore the impurities doped in the layers 12 and 14 are also diffused into the insulator film 13. The insulation resistance in the non-conductive state is thereby lowered, and the breakdown voltage is also reduced. Since the non-doped layers 42 and 43 are present on both sides of the film 13 in the device of FIG. 5, the insulation resistance and the breakdown voltage are maintained.

It is apparent that the present invention is not limited to the above-mentioned embodiments.

What is claimed is:

1. A bidirectional switching circuit comprising:
   a bidirectional non-linear device having a first amorphous silicon layer, a second amorphous silicon layer, an insulator layer sandwiched between said first and second amorphous silicon layers,
   a first electrode connected to said first amorphous silicon layer,
   a second electrode connected to said second amorphous silicon layer,
   first means coupled between said first electrode and said second electrode for applying a positive voltage of an absolute value of more than about 5 volts therebetween to turn said bidirectional switching device ON and to allow an electric current to flow in a direction from said first electrode to said second electrode, and
   second means coupled between said first electrode and said second electrode for applying a negative voltage of an absolute value of more than about 5 volts therebetween to turn said bidirectional switching device ON and to allow an electric current to flow in a direction from said second electrode to said first electrode.

2. The circuit as claimed in claim 1 wherein each of said first and second amorphous silicon layers consists of an impurity-doped amorphous silicon layer and an impurity-non-doped amorphous silicon layer.

3. A liquid crystal display device comprising:
a plurality of row lines,
a plurality of column lines,
a plurality of series connection circuits, said series connection circuits being disposed at the respective intersections of said row and column lines,
a bidirectional switching device in each said series connection circuit, each said bidirectional switching device having a first amorphous silicon layer doped with impurities and electrically connected to one of said row lines, an insulator layer formed on said first amorphous silicon layer, and a second amorphous silicon layer doped with impurities and formed on said insulator layer, said first amorphous silicon layer having the same conductivity type as that of said second amorphous silicon layer,
a liquid crystal display cell in each said series connection circuit, each said liquid crystal display cell having a first electrode coated thereover with a liquid crystal material and being electrically connected to said second amorphous silicon layer of said bidirectional switching device and having a second electrode formed on said liquid crystal material and being electrically connected to one of said column lines,
means for applying a positive voltage exceeding a threshold voltage of said bidirectional switching device between selected row and column lines to turn selected bidirectional switching devices ON, and
means for applying a negative voltage exceeding said threshold voltage between selected row and column lines to turn selected bidirectional switching devices ON.

4. The liquid crystal display device as claimed in claim 3 wherein said bidirectional switching device further has a first intrinsic amorphous silicon layer interposed between said first amorphous silicon layer and said insulator layer and a second intrinsic amorphous silicon layer interposed between said insulator layer and said second amorphous silicon layer.

5. The liquid crystal display device as claimed in claim 3 wherein said insulator layer is selected from a silicon oxide layer and a silicon nitride layer.

* * * * *